United States Patent [19]
Zook et al.

[11] Patent Number: 5,822,337
[45] Date of Patent: Oct. 13, 1998

[54] PROGRAMMABLE REDUNDANCY/ SYNDROME GENERATOR

[75] Inventors: Christopher P. Zook, Boulder; Neal Glover, Broomfield, both of Colo.

[73] Assignee: Cirrus Logic, Inc., Fremont, Calif.

[21] Appl. No.: 565,866

[22] Filed: Dec. 1, 1995

Related U.S. Application Data

[63] Continuation of Ser. No. 124,938, Sep. 21, 1993, Pat. No. 5,473,620.

[51] Int. Cl.$^6$ ............................. G06F 11/10; H03M 13/00
[52] U.S. Cl. ........................................ 371/37.12; 371/37.5
[58] Field of Search ................................ 371/37.12, 37.4, 371/37.5, 37.1

[56] References Cited

U.S. PATENT DOCUMENTS

| | | | |
|---|---|---|---|
| 4,698,813 | 10/1987 | Erdel | 371/40 |
| 4,777,635 | 10/1988 | Glover | 371/40 |
| 4,782,490 | 11/1988 | Tenengolts | 371/40 |
| 4,809,275 | 2/1989 | Inoue et al. | 371/37.1 |
| 4,868,827 | 9/1989 | Yamada et al. | 371/37.5 |
| 4,868,828 | 9/1989 | Shao et al. | 371/5.1 |
| 4,899,341 | 2/1990 | Tomimitsu | 371/37.6 |
| 5,107,503 | 4/1992 | Riggle et al. | 371/32.1 |
| 5,185,711 | 2/1993 | Hattori | 364/746.1 |
| 5,243,604 | 9/1993 | Tsang et al. | 371/40.1 |
| 5,325,373 | 6/1994 | Iwamura et al. | 371/37.1 |
| 5,436,916 | 7/1995 | Nakamura | 371/37.1 |
| 5,442,578 | 8/1995 | Hattori | 364/746.1 |
| 5,444,719 | 8/1995 | Cox et al. | 371/37.1 |
| 5,465,260 | 11/1995 | Zook | 371/37.7 |
| 5,495,488 | 2/1996 | Nakamura | 371/37.1 |
| 5,517,509 | 5/1996 | Yoneda | 371/37.1 |

FOREIGN PATENT DOCUMENTS

| | | |
|---|---|---|
| 63-164629 | 7/1988 | Japan . |
| 4365139 | 12/1992 | Japan . |

OTHER PUBLICATIONS

*Specification for the OSI EDAC Part,* Data Systems Technology Corp., Aug. 16, 1988.

Primary Examiner—Paul P. Gordon
Attorney, Agent, or Firm—Roger W. Blakely, Jr.; Dan A. Shifrin

[57] ABSTRACT

An apparatus and method of generating redundancy symbols and syndromes which is order-programmable is disclosed. The apparatus and method involves the implementation of an error correcting encoder/decoder for polynomial codes which uses a single circuit to generate check symbols during the transmit operation and to generate syndromes during a receive operation. The selection of roots for the code generator, and hence, the code order is programmable.

18 Claims, 6 Drawing Sheets

PROGRAMMABLE REDUNDANCY/SYNDROME GENERATOR

This is a Continuation application of application Ser. No. 08/124,938, filed Sep. 21, 1993 now U.S. Pat. No. 5,473,620.

FIELD OF THE INVENTION

This invention relates generally to digital data communication systems, particularly to the encoding and decoding of error correcting codes.

BACKGROUND OF THE INVENTION

In a digital data communication system (including storage and retrieval from optical or magnetic media) in order to increase the transfer rate of information and at the same time make the error rate arbitrarily low, it is necessary to employ an error control system. For fixed signal-to-noise ratios and fixed bandwidths, improvements can be made through the use of error-correcting codes.

With error-correction coding the data to be transmitted or stored is mathematically processed to obtain additional data symbols called check symbols or redundancy symbols. The data and check symbols together make up a codeword. After transmission or retrieval the codeword is mathematically processed to obtain error syndromes which contain information about locations and values of errors.

For many error-correcting codes (e.g. polynomial codes such as, but not limited to, Reed-Solomon codes) the codewords are formed by appending a remainder polynomial (redundancy symbols) to a data polynomial so as to make the composite polynomial divisible by a generator polynomial. The remainder polynomial is obtained by dividing the data polynomial by the generator polynomial and keeping the remainder polynomial. The error syndromes are obtained by dividing the received polynomial (a codeword polynomial which may have an error polynomial added to it) by the individual factors of the generator polynomial.

PRIOR ART

FIG. 1 shows a circuit which can generate redundancy symbols by performing polynomial division.

FIG. 2 shows a plurality of first-order dividers in which each can generate one of the error syndromes.

Prior Art Limitations

One problem arising in the use of these codes is the significant amount of circuitry needed in high-speed implementations of high-order (capable of correcting many errors) generators for the redundancy symbols and the error syndromes. For systems which require the ability to do both the encoding and decoding, albeit not simultaneously, it is a desirable trait to have one circuit capable of generating both sets of symbols. It is also a desirable trait for the encoder to be programmable so as to be able to produce different order codes (codewords with different numbers of redundancy bytes). The usual method has neither of these traits.

U.S. Pat. No. 4,777,635 entitled "REED-SOLOMON CODE ENCODER and SYNDROME GENERATOR CIRCUIT" issued to Neal Glover discloses a circuit which can generate both redundancy and syndrome symbols but is not order-programmable.

The Berlekamp-Welch algorithm is a general decoding algorithm which does not use syndromes but instead uses the encoder circuit to compute a remainder from the received polynomial. However the algorithm is a bit more complicated than that which processes syndromes and it is not order-programmable. It is also possible to convert the remainder to syndromes but this requires significant additional circuitry.

SUMMARY OF THE INVENTION

It is an object of the present invention to decrease the size of the circuitry in a hardware implementation of an error correcting encoder/decoder by using a single circuit to generate check symbols during the transmit operation and to also generate syndromes during a receive operation.

Another object is to decrease the size of the circuitry in a hardware implementation of an error correcting encoder/decoder by using a single circuit to generate check symbols for codewords containing differing numbers of check symbols.

DETAILED DESCRIPTION OF THE INVENTION

This invention includes a method and apparatus capable of generating redundancy symbols and syndromes and is order-programmable. The theory of operation of this invention is as follows: Polynomial codes consist of codewords which are multiples of a generator polynomial. A codeword, c(x), is formed by dividing a data polynomial, D(x), of degree less than k by a generator polynomial, g(x) of degree n-k to obtain a redundancy polynomial, r(x), of degree less than n-k. Appending r(x) to D(x) yields c(x) of degree less than n (i.e. there are k data symbols and n-k redundancy symbols and n total symbols, each symbol having a predetermined plurality of bits m).

$$g(x) = \prod_{j=0}^{n-k-1} (x + r_j)$$

$$r(x) = D(x) \times x^{n-k} \bmod(g(x))$$

$$c(x) = D(x) \times x^{n-k} + r(x)$$

The following explanation will show that it is possible to feed D(x) into a cascade of first-order dividers (where each divider divides by one factor, $(x+r_j)$) to generate r(x). These first order dividers can then be used to generate syndromes during read-operations (decoding).

Figure 1:
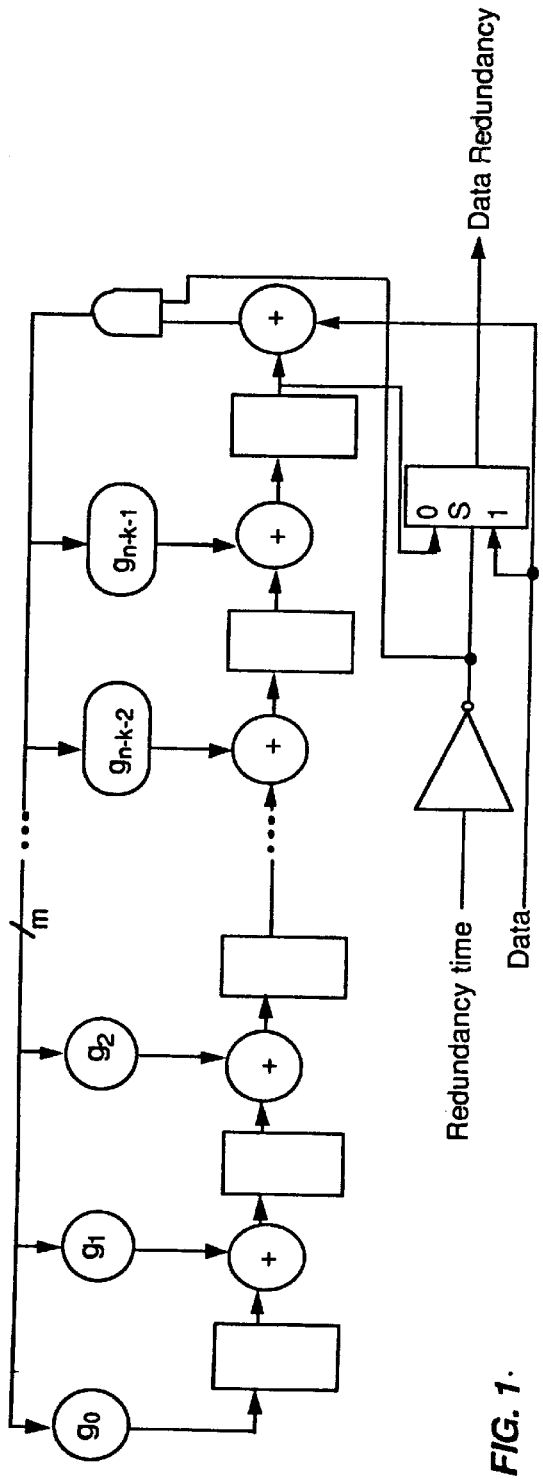
FIG. 1 shows the prior-art solution for generating redundancy symbols.
Figure 2:
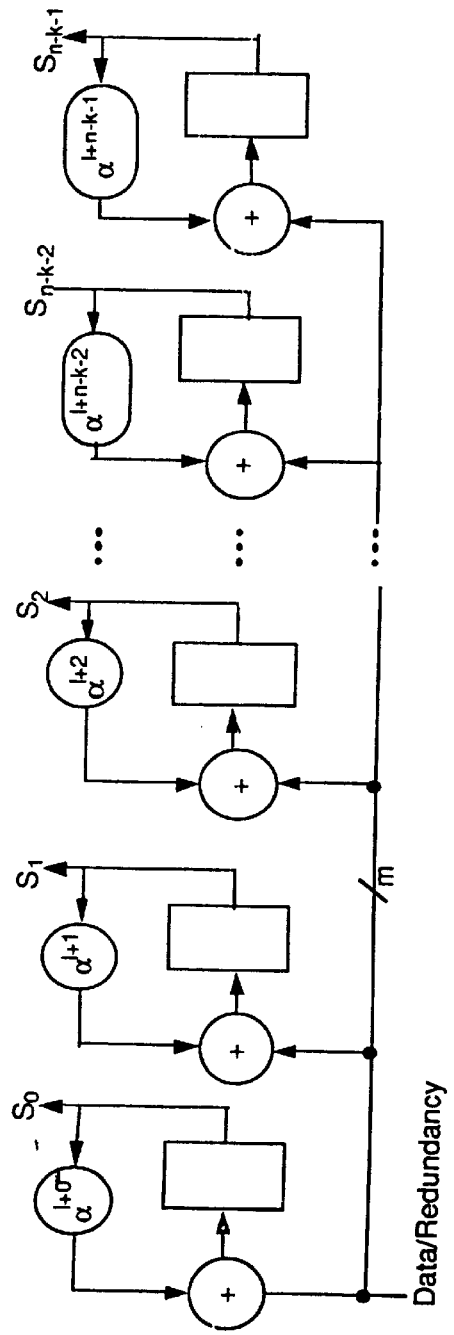
FIG. 2 shows the prior-art solution for generating syndromes.
Figure 3:
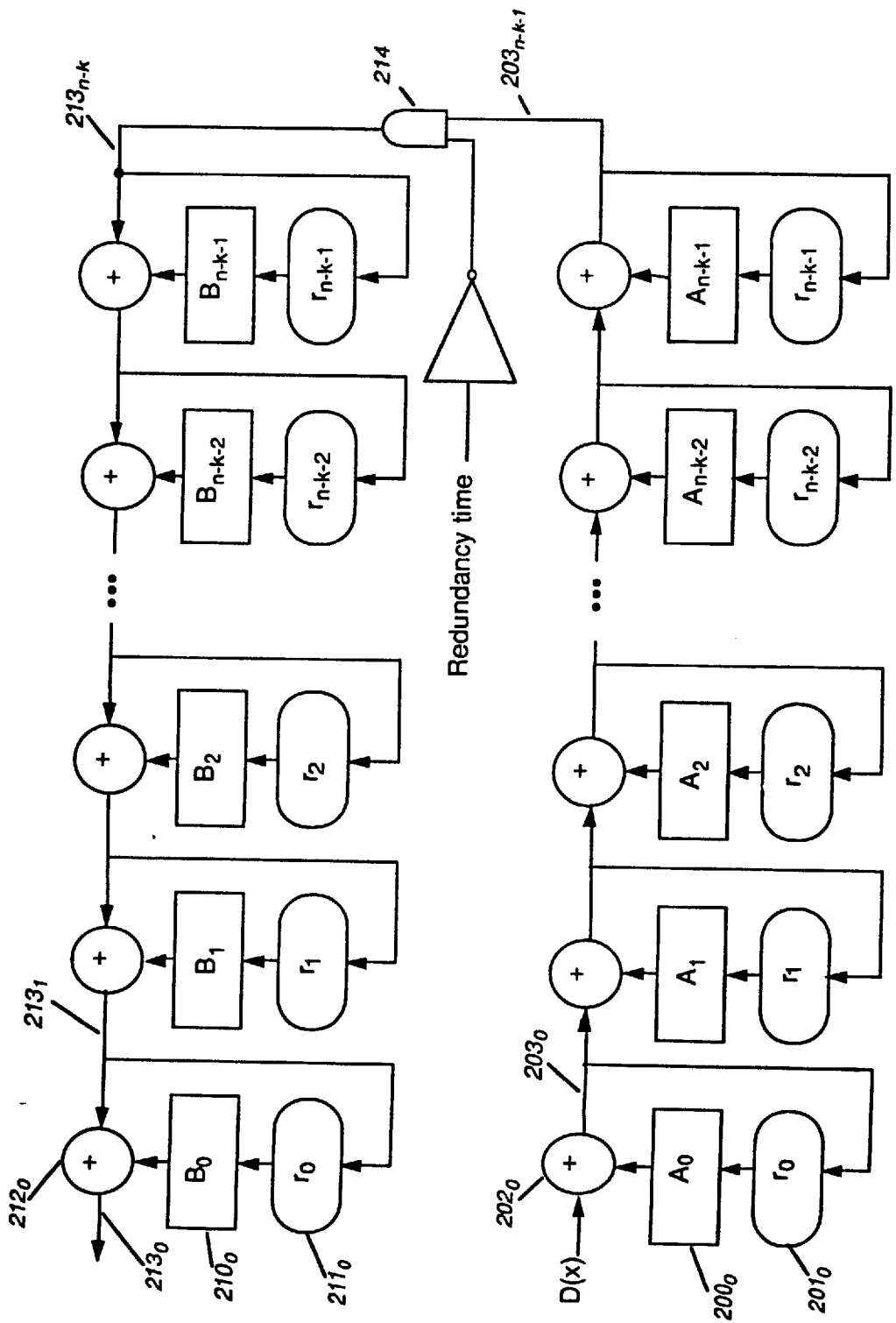
FIG. 3 illustrates the basic principle utilized in the present invention.

FIG. 3 shows a cascade of first-order polynomial dividers followed by a cascade of first-order polynomial multipliers. Each polynomial divider is made of a register $200_j$ a constant multiplier $201_j$ and adder $202_j$ each one symbol wide where again, j ranges from 0 to n-k-1. The output of each polynomial divider is the input polynomial multiplied by x and divided by $(x+r_j)$. Each polynomial multiplier is made of a register $210_j$, a constant multiplier $211_j$ and an adder $212_j$, and multiplies its input by $(x+r_j)$. At each step of operation (simultaneous clocking of all registers and inputting a further symbol) the output of each divider matches the input to the corresponding multiplier, e.g. $203_0$ matches $213_1$. Also each divider register matches the corresponding multiplier register, e.g. $A_j$ matches $B_j$. The output of divider cascade $203_{n-k-1}$ is:

$$203_{n-k-1} = \frac{x^{n-k}D(x)}{\prod_{j=0}^{n-k-1}(x+r_j)} = \frac{x^{n-k}D(x)}{g(x)} = q(x)$$

And $$x^{n-k}D(x) - q(x) \times g(x) = x^{n-k}D(x) \bmod(g(x))$$

Therefore $$q(x) = \frac{x^{n-k}D(x) - x^{n-k}D(x)\bmod(g(x))}{g(x)}$$

The output of the multiplier cascade is q(x) g(x). The first k terms (symbols) appearing on $203_{n-k-1}$ is q(x) and the first k terms (symbols) appearing on $213_0$ is D(x). To obtain the rest of q(x) g(x), the input to the multiplier cascade is set to zero by the gate 214 and the circuit is clocked n-k more times. During these clocks the output of the multiplier cascade, $213_0$, is $x^{n-k}D(x)$ mod g(x), which is the series of redundancy symbols in a polynomial code.

Implementation

Figure 4:
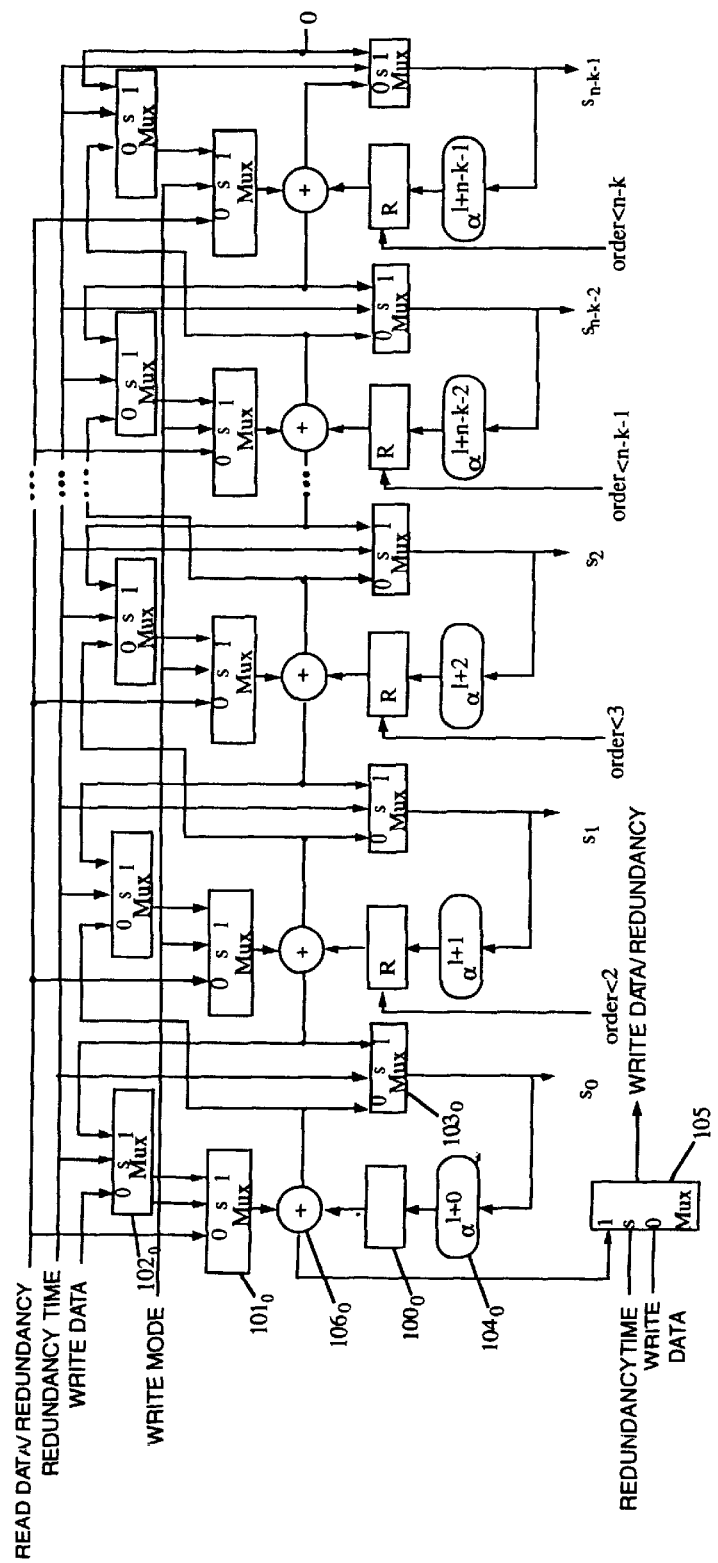
FIG. 4 shows a block diagram of the preferred embodiment of the present invention.

Since the multiplier registers in FIG. 3 always match the divider registers, the multiplier cascade can be discarded and during the last n-k clocks the divider can be connected as a multiplier cascade to yield the redundancy symbol S. This is illustrated in FIG. 4. Then when REDUNDANCY TIME is OFF the MUXes 102 and 103 cause the registers 100 and constant multipliers 104 to be connected so as to form a cascade of dividers from left to right (the adders 106 add from left to right). When REDUNDANCY TIME is ON the MUXes 102 and 103 cause the registers 100 and constant multipliers 104 to be connected so as to form a cascade of multipliers from right to left (the adders add from right to left). The function of the MUXes 101 is to form separate dividers (not in a cascade) for syndrome generation.

During a write-operation (encoding) WRITE MODE is ON. For the first k clock times REDUNDANCY TIME is OFF and the input data bytes are passed through to the output of MUX 105. For the last n-k clock times REDUNDANCY TIME is ON and the redundancy symbols are present at the output of MUX 105.

During a read-operation WRITE MODE is OFF and REDUNDANCY TIME is OFF and the entire received polynomial consisting of data and redundancy is input for n clock times. During the last clock time the syndromes are available on the output of MUXes 103.

By holding the reset input to a register ON during redundancy generation the corresponding root for that register is left out of the redundancy computation. This allows the selection of roots to be entirely programmable, and in particular it allows the number of roots (code order) to be programmable.

The generator shown in FIG. 4 is for a Reed-Solomon code (i.e. the roots as shown in the constant multipliers 104 are consecutive powers of alpha, a primitive root of the field). However the invention applies to any polynomial code with any selection of roots. The resets to the registers 100 are "ORDER<j", which is the selection criterion for Reed-Solomon codes (i.e. ORDER consecutive roots are included and the remainder are left out, where ORDER is the number of roots in the generator). However any selection criterion may be used.

Figure 5:
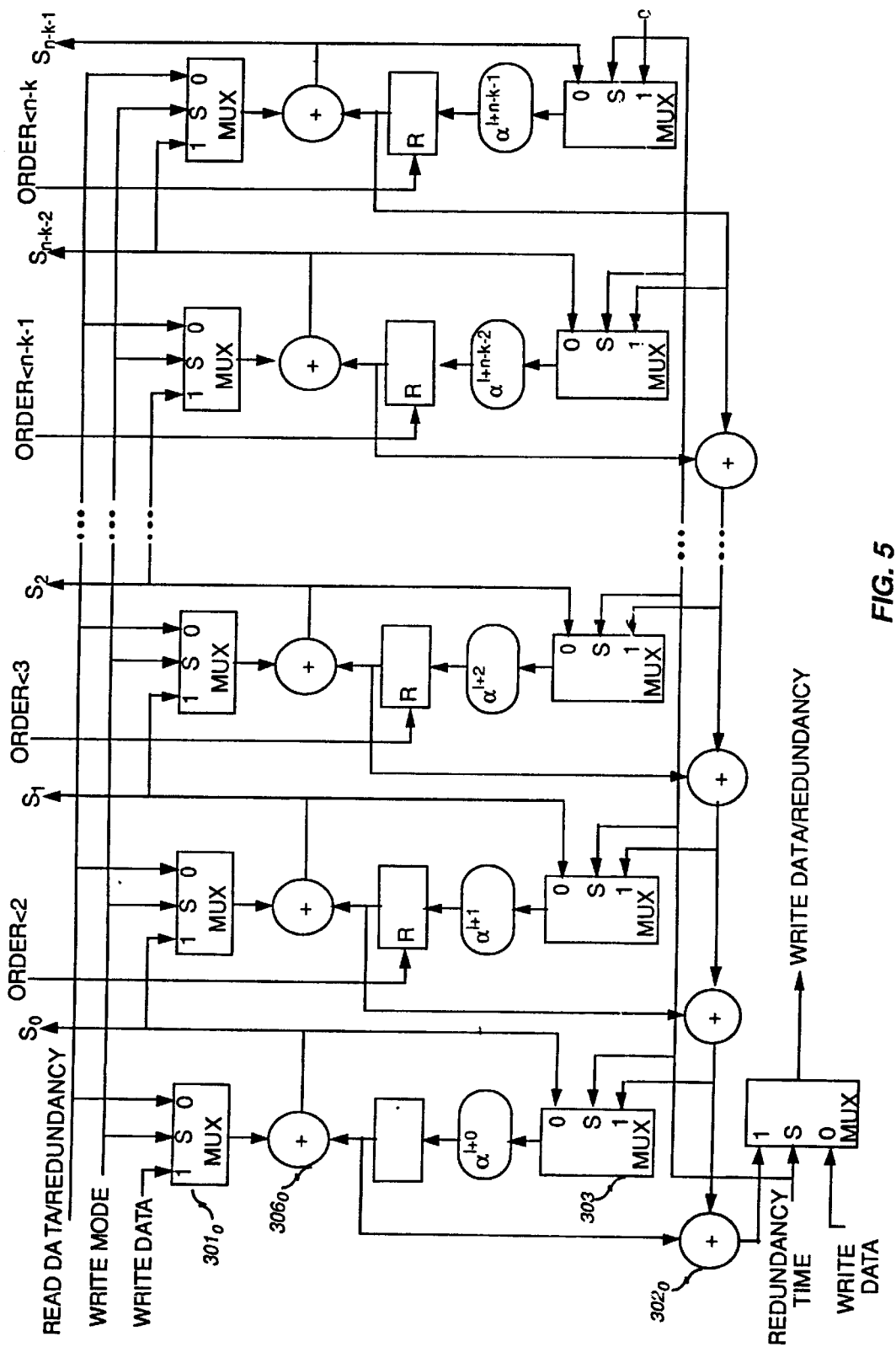
FIG. 5 shows a block diagram of an alternate embodiment of the present invention.

FIG. 5 shows an alternate implementation in which one set of MUXes is removed from the adder chain of FIG. 4 and a second adder chain is added. The upper adder chain 306 only adds from left to right (for data time) and the lower adder chain 302 only adds from right to left (for redundancy time). This allows faster operation at the expense of more gates (trading MUXes for adders). MUXes 303 switch between having a divider cascade for data time or having a multiplier cascade for redundancy time. MUXes 301 switch between having a cascade of dividers/multipliers for encoding and having separate dividers for syndrome generation.

Figure 6:
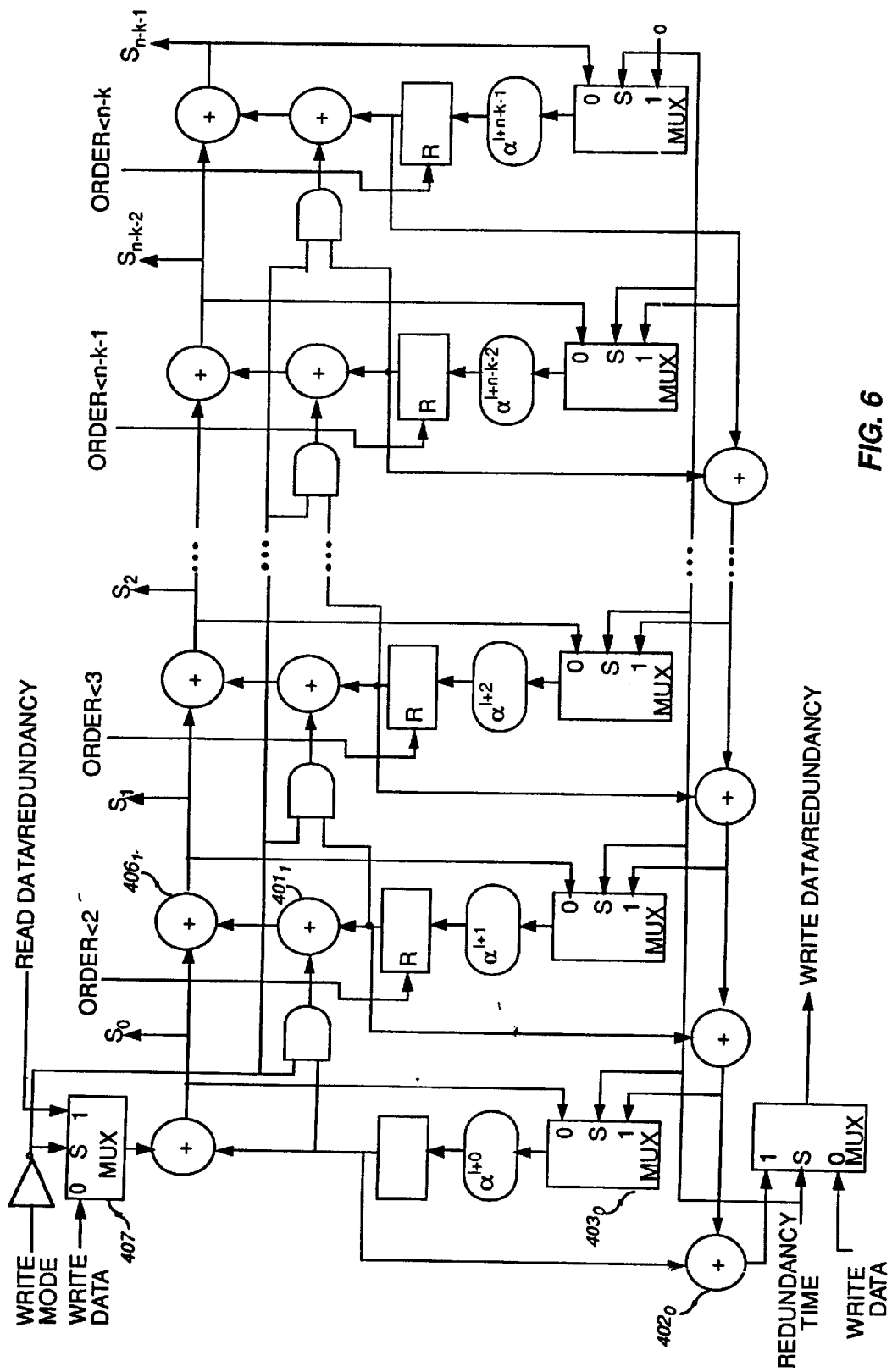
FIG. 6 shows a block diagram of a further alternate embodiment of the present invention.

FIG. 6 shows an alternate implementation in which the set of MUXes is removed from the upper adder chain in FIG. 5 and its function of allowing syndrome generation is performed by including the set of adders 401 and MUX 407. The lower adder chain 402 and MUXes 403 remain the same as the lower adder chain 302 and MUXes 303 of FIG. 5. During read mode, MUX 407 allows read data to be the input and adder chain 401 is enabled which causes the register REG output for each stage to be added to the next stage twice through adders 401 and 406. This effectively decouples each stage, since in the finite field of $GF(2^m)$, adding an element to itself results in zero. This allows for the fastest operation, at the expense of more gates (trading MUXes for adders), as the adder chain 406 no longer contains any MUXes.

Figure 7:
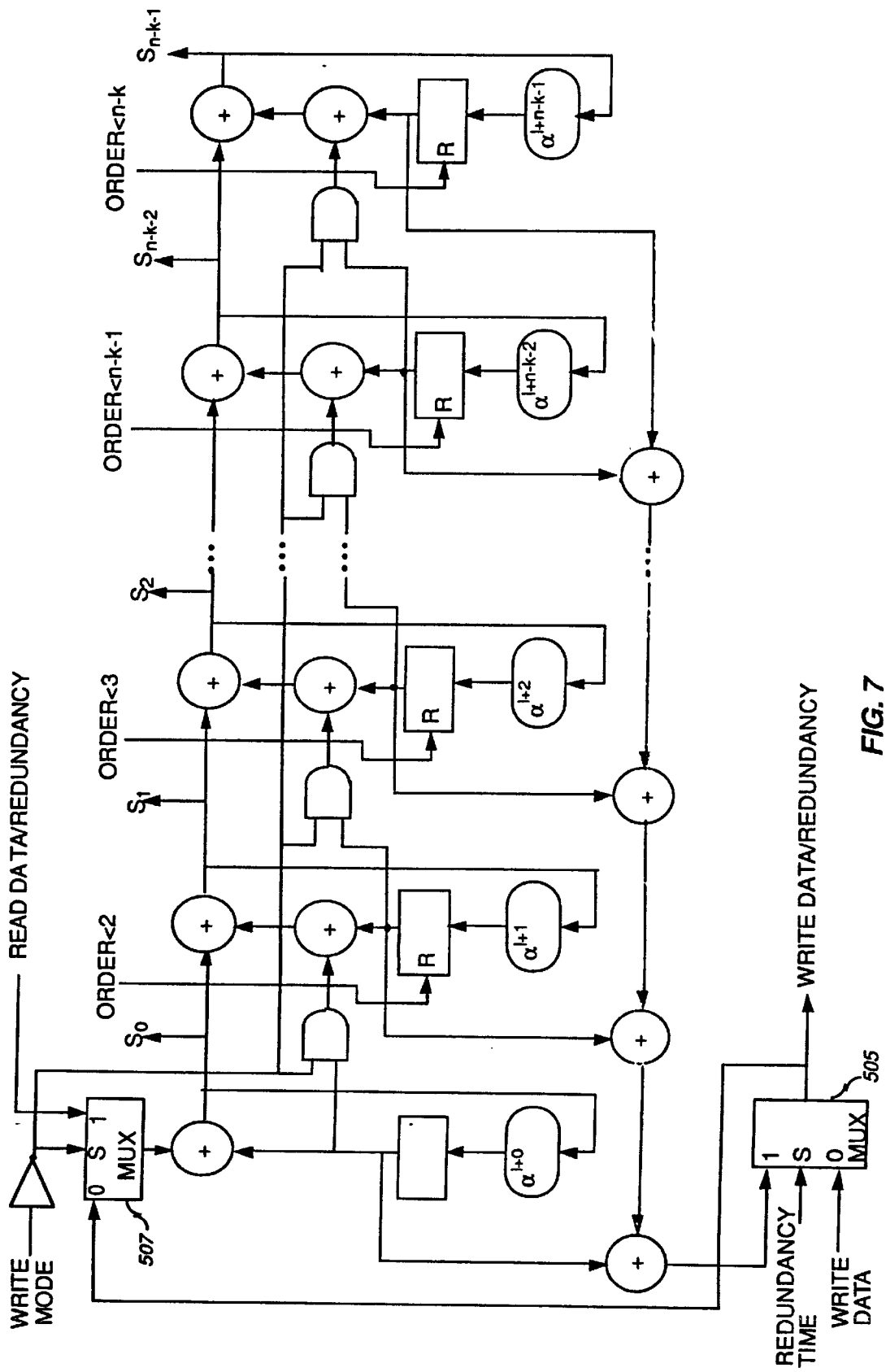
FIG. 7 shows a block diagram of a still further alternate embodiment of the present invention.

FIG. 7 shows an alternate implementation in which the MUXes in FIG. 6 have been eliminated. The sections remain in the divider configuration during redundancy time but the input switches from data to redundancy through MUXes 505 and 507. Because of the cancellation that occurs when elements are added to themselves, adding the output of the lower adder chain, which is equal to the sum of the contents of the registers REG, to the input of the upper adder chain, has the same function and result as actually changing the configuration from left-to-right dividers to right-to-left multipliers as in the other implementations.

While the preferred embodiment and various alternative embodiments of the invention have been disclosed and described in detail herein, it will be obvious to those skilled in the art that various changes in form and detail may be made therein without departing from the spirit and scope thereof.

We claim:

1. An error correction circuit for encoding binary data in the form of data polynomials D(x) into transmitted codeword polynomials C(x) transmitted through a communication channel, comprising:

(a) a data input connected to receive the binary data;
   (b) a division circuit for dividing the data polynomial D(x) by a predetermined generator polynomial g(x) to generate a quotient polynomial q(x); and
   (c) a multiplier circuit for multiplying at least part of the quotient polynomial q(x) by the generator polynomial g(x) to generate at least part of the transmitted codeword polynomial C(x).

2. The error correction circuit as recited in claim 1, wherein the generator polynomial g(x) is order programmable.

3. The error correction circuit as recited in claim 2, further comprising a codeword input connected to receive a received polynomial from the communication channel, wherein:
   (a) the received polynomial is the transmitted codeword polynomial plus an error polynomial; and
   (b) the divider circuit divides the received polynomial by a plurality of factors of the generator polynomial g(x) to generate error syndromes.

4. The error correction circuit as recited in claim 1, wherein:
   (a) the coefficients of the transmitted codeword polynomial C(x) comprise n symbols;
   (b) the coefficients of the data polynomial D(x) comprise k symbols;
   (c) the coefficients of the generator polynomial g(x) comprise n-k symbols;
   (d) each symbol comprises m bits; and
   (e) the division circuit multiplies the data polynomial D(x) by $x^{n-k}$ and divides by generator polynomial g(x).

5. The error correction circuit as recited in claim 4, wherein:
   (a) the generator polynomial g(x) comprises n-k factors $(x+r_j)$; and
   (a) the division circuit comprises n-k first order divider circuits corresponding to the factors $(x+r_j)$ of the generator polynomial.

6. The error correction circuit as recited in claim 4, further comprising a codeword input connected to receive a received polynomial from the communication channel, wherein:
   (a) the received polynomial is the transmitted codeword polynomial plus an error polynomial; and
   (b) the divider circuit divides the received polynomial by a plurality of factors of the generator polynomial g(x) to generate error syndromes.

7. The error correction circuit as recited in claim 1, wherein the multiplier, circuit is reconfigureable to provide the division circuit.

8. The error correction circuit as recited in claim 7, wherein:
   (a) the division circuit comprises a plurality of cascaded first order divider circuits; and
   (b) the plurality of cascaded first order divider circuits are configured into a plurality of cascaded first order multiplier circuits for multiplying at least part of the quotient polynomial q(x) by the generator polynomial g(x) to generate at least part of the transmitted codeword polynomial C(x).

9. The error correction circuit as recited in claim 1, further comprising a codeword input connected to receive a received polynomial from the communication channel, wherein:
   (a) the received polynomial is the transmitted codeword polynomial plus an error polynomial; and
   (b) the divider circuit divides the received polynomial by a plurality of factors of the generator polynomial g(x) to generate error syndromes.

10. A method for error correcting in a binary communication channel, comprising the steps of:
    (a) encoding binary data in the form of data polynomials D(x) into transmitted codeword polynomials C(x), comprising the steps of:
       (a) dividing the data polynomial D(x) by a predetermined generator polynomial g(x) to generate a quotient polynomial q(x); and
       (b) multiplying at least part of the quotient polynomial q(x) by the generator polynomial g(x) to generate at least part of the transmitted codeword polynomial C(x);
    (b) transmitting the transmitted codeword polynomials C(x) through the communication channel.

11. The method for error correcting as recited in claim 10, wherein the generator polynomial g(x) is order programmable.

12. The method for error correcting as recited in claim 11, further comprising the steps of:
    (a) receiving, from the communication channel, a received polynomial comprised of the transmitted codeword polynomial and an error polynomial; and
    (b) dividing the received polynomial by a plurality of factors of the generator polynomial g(x) to generate error syndromes.

13. The method for error correcting as recited in claim 10, wherein:
    (a) the coefficients of the transmitted codeword polynomial C(x) comprise n symbols;
    (b) the coefficients of the data polynomial D(x) comprise k symbols;
    (c) the coefficients of the generator polynomial g(x) comprise n-k symbols;
    (d) each symbol comprises m bits; and
    (e) the step of dividing multiplies the data polynomial D(x) by $x^{n-k}$ and divides by the generator polynomial g(x).

14. The method for error correcting as recited in claim 13, wherein:
    (a) the generator polynomial g(x) comprises n-k factors $(x+r_j)$; and
    (a) the step of dividing uses n-k first order divider circuits corresponding to the factors $(x+r_j)$ of the generator polynomial.

15. The method for error correcting as recited in claim 13, further comprising the steps of:
    (a) receiving, from the communication channel, a received polynomial comprised of the transmitted codeword polynomial and an error polynomial; and
    (b) dividing the received polynomial by a plurality of factors of the generator polynomial g(x) to generate error syndromes.

16. The method for error correcting as recited in claim 10, wherein the step of dividing and multiplying is done in circuitry which may be configured as a divider or a multiplier.

17. The method for error correcting as recited in claim 16, wherein the step of dividing uses a plurality of cascaded first order divider circuits, further comprising the step of configuring the divider circuits into a plurality of cascaded first order multiplier circuits for use in the step of multiplying at least part of the quotient polynomial q(x) by the generator polynomial g(x) to generate at least part of the transmitted codeword polynomial C(x).

18. The method for error correcting as recited in claim 10, further comprising the steps of:
    (a) receiving, from the communication channel, a received polynomial comprised of the transmitted codeword polynomial and an error polynomial; and
    (b) dividing the received polynomial by a plurality of factors of the generator polynomial g(x) to generate error syndromes.

* * * * *